United States Patent
Myung et al.

(10) Patent No.: US 12,274,131 B2
(45) Date of Patent: *Apr. 8, 2025

(54) ORGANIC LIGHT EMITTING DEVICE HAVING FIRST AND SECOND BANKS EXTENDED TO A DUMMY AREA

(71) Applicant: LG Display Co., Ltd., Seoul (KR)

(72) Inventors: Jaehwan Myung, Paju-si (KR); Hanhee Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 710 days.

This patent is subject to a terminal disclaimer.

(21) Appl. No.: 17/084,459

(22) Filed: Oct. 29, 2020

(65) Prior Publication Data

US 2021/0050396 A1 Feb. 18, 2021

Related U.S. Application Data

(63) Continuation of application No. 16/400,977, filed on May 1, 2019, now Pat. No. 10,854,694.

(30) Foreign Application Priority Data

Dec. 18, 2018 (KR) .................. 10-2018-0164468

(51) Int. Cl.
*H10K 59/122* (2023.01)
*H10K 59/00* (2023.01)
(Continued)

(52) U.S. Cl.
CPC ........... *H10K 59/122* (2023.02); *H10K 59/00* (2023.02); *H10K 59/10* (2023.02); *H10K 59/12* (2023.02);
(Continued)

(58) Field of Classification Search
CPC ...... H10K 59/122; H10K 59/00; H10K 59/10; H10K 59/88; H10K 59/123; H10K 59/12; H10K 59/35; H10K 59/124
(Continued)

(56) References Cited

U.S. PATENT DOCUMENTS 9,881,987 B2 1/2018 Choi
10,134,819 B2 11/2018 Mori et al.
(Continued)

FOREIGN PATENT DOCUMENTS

CN 1832646 A 9/2006
CN 107863366 A 3/2018
(Continued)

OTHER PUBLICATIONS

United States Office Action, U.S. Appl. No. 16/400,977, filed Apr. 3, 2020, seven pages.
(Continued)

*Primary Examiner* — Xia L Cross
(74) *Attorney, Agent, or Firm* — Fenwick & West LLP

(57) ABSTRACT

An organic light-emitting display device comprises a substrate comprising a display area with sub-pixels arranged along a first direction and a second direction intersecting the first direction and a non-display area surrounding the display area; an overcoat layer placed on the substrate; first electrodes placed on the overcoat layer and allocated to the sub-pixels; a first bank that is placed in the display area and the non-display area and has first openings exposing the first electrode; a second bank that is placed in the display area and the non-display area and has second openings exposing the first electrodes arranged along the second direction on the first bank; and organic light-emitting layers placed on the second openings, wherein the second openings expose the first bank in the non-display area.

10 Claims, 16 Drawing Sheets

(51) Int. Cl.
*H10K 59/10* (2023.01)
*H10K 59/12* (2023.01)
*H10K 59/123* (2023.01)
*H10K 59/88* (2023.01)
*H10K 59/124* (2023.01)
*H10K 59/35* (2023.01)

(52) U.S. Cl.
CPC .......... *H10K 59/123* (2023.02); *H10K 59/88* (2023.02); *H10K 59/124* (2023.02); *H10K 59/35* (2023.02)

(58) Field of Classification Search
USPC .......................................... 257/40
See application file for complete search history.

(56) References Cited

U.S. PATENT DOCUMENTS

| | | | |
|---|---|---|---|
| 10,446,625 | B2 | 10/2019 | Lee |
| 10,943,962 | B2 | 3/2021 | Ryoo et al. |
| 2012/0313509 | A1 | 12/2012 | Takagi et al. |
| 2016/0181335 | A1 | 6/2016 | Mori et al. |
| 2017/0345881 | A1* | 11/2017 | Kim .................. H10K 59/123 |
| 2018/0083077 | A1* | 3/2018 | Lee .................. H10K 59/122 |
| 2018/0166525 | A1 | 6/2018 | Kim et al. |
| 2018/0197929 | A1 | 7/2018 | Cho et al. |
| 2019/0157363 | A1 | 5/2019 | Lee |
| 2019/0189711 | A1 | 6/2019 | Ryoo et al. |

FOREIGN PATENT DOCUMENTS

| | | |
|---|---|---|
| CN | 110010778 A | 7/2019 |
| KR | 10-2016-0024385 A | 3/2016 |
| KR | 10-1703175 B1 | 2/2017 |
| KR | 10-2017-0079336 A | 7/2017 |

OTHER PUBLICATIONS

The German Patent and Trademark Office, Office Action, DE Patent Application No. 102019132804.7, Dec. 23, 2022, 14 pages.

China National Intellectual Property Administration, Office Action, CN Patent Application No. 201911265591.4, Jul. 25, 2022, 11 pages.

Korean Intellectual Property Office, Office Action, Korean Patent Application No. 10-2018-0164468, Sep. 9, 2023, 11 pages.

Korean Intellectual Property Office, Office Action, Korean Patent Application No. 10-2018-0164468, Apr. 23, 2024, nine pages.

* cited by examiner

— 1st Bank Boundary
— 2nd Bank Boundary

ORGANIC LIGHT EMITTING DEVICE HAVING FIRST AND SECOND BANKS EXTENDED TO A DUMMY AREA

CROSS-REFERENCE TO RELATED APPLICATION

This application is a continuation application of U.S. patent application Ser. No. 16/400,977 filed on May 1, 2019, which claims the priority benefit of Republic of Korea Patent Application No. 10-2018-0164468 filed on Dec. 18, 2018, all of which are incorporated herein by reference for all purposes as if fully set forth herein.

BACKGROUND

Field

The present invention relates to an organic light-emitting display device.

Related Art

Recently, various display devices that are less bulky and more lightweight than cathode ray tubes (CRTs) are being developed. Examples of these display devices include liquid crystal displays (LCDs), plasma display panels (PDPs), field emission displays (FEDs), organic light-emitting display devices, etc.

The organic light-emitting display devices are self-luminous devices, and offer several advantages such as fast response time, high light emission efficiency, high brightness, and wide viewing angle. Moreover, the organic light-emitting display devices may be implemented as a flexible display device because they can be fabricated on a flexible substrate such as plastic.

In keeping with the recent trend towards large-area, high-resolution organic light-emitting display devices, a single panel comprises a plurality of sub-pixels. Generally, masks are used to pattern red (R), green (G), and blue (B) subpixels. Thus, a large-area, high-resolution display device requires a corresponding large-area fine metal mask (FMM). The larger the area of the mask, the more it will sag, which leads to various defects such as displacement of organic light-emitting materials constituting an emission layer.

As a way to solve the problems of the aforementioned method of deposition using a mask, a solution process is getting attention because it is simple to implement and has advantages in large-area display devices. The solution process enables large-area patterning through inkjet printing or nozzle printing, without using a mask, and has a material use rate of 50 to 80%, which is very high compared to vacuum deposition which has a material use rate no higher than 10%. Also, the solution process offers good thermal stability and morphological properties because it provides a higher glass transition temperature than vacuum-deposited thin films.

However, forming an emission layer by a solution process can result in non-uniform thickness because its thickness varies depending on its position in a sub-pixel. As a result, the display quality of the display device may be deteriorated.

SUMMARY

Embodiments relates to an organic light-emitting display device including, a substrate, an overcoat layer, first electrodes, a first bank, a second bank, and an organic light-emitting layers. The substrate includes a display area with sub-pixels arranged along a first direction and a second direction intersecting the first direction and a non-display area surrounding the display area. The overcoat layer is placed on the substrate. The first electrodes are placed on the overcoat layer and allocated to the sub-pixels. The first bank is placed in the display area and the non-display area and has first openings exposing the first electrode. On the first bank, a second bank is placed in the display area and the non-display area and has second openings exposing the first electrodes, the second opening arranged along the second direction, the second openings exposing at least the first bank in the non-display area. The organic light-emitting layers are placed on the second openings. The organic light-emitting layers have concaved surfaces at edges contacting the second bank.

In one or more embodiments, the overcoat layer is placed in the display area but not in the non-display area.

In one or more embodiments, the second bank has a first thickness in an area corresponding to a stepped portion formed on one edge of the overcoat layer and a second thickness in an area corresponding to the display area, wherein the first thickness is greater than the second thickness.

In one or more embodiments, the second bank has a first width in the first direction in an area corresponding to a stepped portion formed on one edge of the overcoat layer and a second width in the first direction in an area corresponding to the display area. The first width is greater than the second width.

In one or more embodiments, at least one of the second openings has a first width in the first direction in the display area and a second width different from the first width in the non-display area.

In one or more embodiments, the second openings comprise (2-1)th openings which have a (1-1)th width in the first direction in the display area; and (2-2)th openings which have a (1-2)th width smaller than the (1-1)th width in the first direction in the display area. The (2-1)th openings have a (2-1)th width smaller than the (1-1)th width in the first direction in the non-display area. The (2-2)th openings have a (2-2)th width larger than the (1-2)th width in the first direction in the non-display area.

In one or more embodiments, a difference between the (1-1)th width and the (2-1)th width is equal to a difference between the (2-1)th width and the (2-2)th width.

In one or more embodiments, the second openings comprise (2-3)th openings which have a (1-3)th width in the first direction in the display area and the non-display area.

In one or more embodiments, wherein the second openings comprise (2-3)th openings which have a (1-3)th width in the first direction in the display area and a (2-3)th width in the first direction in the non-display area. The (1-3)th width and the (2-3)th width are different.

In one or more embodiments, the first bank is hydrophilic, and the second bank is hydrophobic.

In one or more embodiments, at least the first bank exposed by the second openings comprises portions of the first bank between adjacent lines sub-pixels and in a dummy area.

In one or more embodiments, portions of the organic light emitting layer adjacent to the second bank in the dummy area comprise a mound or a valley.

Embodiments also relate to an organic light-emitting display device comprising a substrate, first electrodes, a first bank, a second bank, organic light-emitting layers, and second electrodes. The substrate comprising a display area with sub-pixels and a non-display area surrounding the display area. The first electrodes are on the substrate. The first bank selectively cover at least the first electrodes to define first openings. The second bank selectively covers the first bank to partition lines of sub-pixels and define second openings that extend along the display area into the non-display area. The organic light-emitting layers contact the first electrodes through the first openings. The second electrodes are on the organic light-emitting layers.

In one or more embodiments, at least one line of the sub-pixels is configured to emit light of the same color.

In one or more embodiments, the organic light-emitting display device further comprises overcoat layers on portions of the substrate. The first electrodes cover the overcoat layers and connect to transistors at locations between the overcoat layers.

In one or more embodiments, the second openings extend into a dummy area of the non-display area where the overcoat layers are absent.

In one or more embodiments, the second bank has a first thickness at stepped portions between the dummy area and the display area. The second bank has a second thickness outside the stepped portion. The second thickness is thinner than the first thickness.

In one or more embodiments, a thickness of the second bank in a part of the stepped portions without the overcoat layers is thicker than a thickness of the second bank in another part of the stepped portions with the overcoat layers.

In one or more embodiments, a width of the second bank in the stepped portion is wider than a width of the second bank in the display area.

In one or more embodiments, the first electrodes are hydrophobic and the first bank is hydrophilic.

In one or more embodiments, the second bank is hydrophobic.

In one or more embodiments, at least two of the second openings have different widths in the display area. The widths defined along a direction that is perpendicular to another direction along which the line of the sub-pixels extends.

In one or more embodiments, one of the at least two of the second openings have a first width in the display area and a second width in the non-display area, and another of the at least two second openings have a third width in the display area and a fourth width in the non-display area, wherein the first width is larger the third width, and wherein the second width is smaller than the fourth width.

In one or more embodiments, a difference between the first and third widths is the same as a different between the second and fourth widths.

In one or more embodiments, the organic light-emitting layers have concaved surfaces at edges contacting the second bank.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
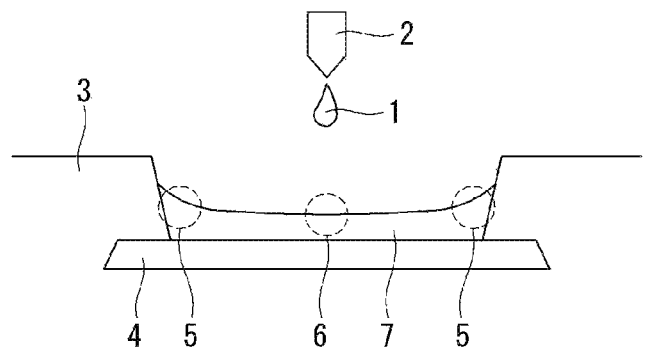
FIG. 1 is a view for explaining the problems of a solution process.

Hereinafter, exemplary embodiments of the present invention will be described in detail with reference to the attached drawings. Throughout the specification, like reference numerals denote substantially like components. In describing the present invention, a detailed description of known functions or configurations related to the present invention will be omitted when it is deemed that they may unnecessarily obscure the subject matter of the present invention. In describing various exemplary embodiments, descriptions of the same or like components will be given in the beginning but omitted in other exemplary embodiments.

Although terms including ordinal numbers such as "first" and "second" may be used to describe various components, the components are not limited by the terms. The terms are used only to distinguish one component from other components.

FIG. 1 is a view for explaining the problems of a solution process. Referring to FIG. 1, forming an organic light-emitting layer using a solution process has the problem of deteriorating the light emission characteristics of organic light-emitting display devices due to pileup. More specifically, an organic light-emitting material 1 is dropped by inkjet equipment 2 or the like onto a first electrode 4 divided up by a bank 3. The dropped organic light-emitting material 1 has a thickness deviation depending on the position, due to differences in hardening rate in the hardening process. That is, a non-uniform organic light-emitting layer 7 is formed which is thick at the edge 5 adjoining the bank and thin at the center 6.

The formation of the non-uniform organic light-emitting layer 7 can bring about the problem of deterioration in display quality because brightness varies with position. In addition, the lifetime of the device can degrade due to differences in current density within the organic light-emitting layer 7, or the process yield can be lowered due to formation of dark spots. In view of this, it is advantageous to reduce the pile-up area as much as possible when forming the emission layer by using the solution process.

Figure 2:
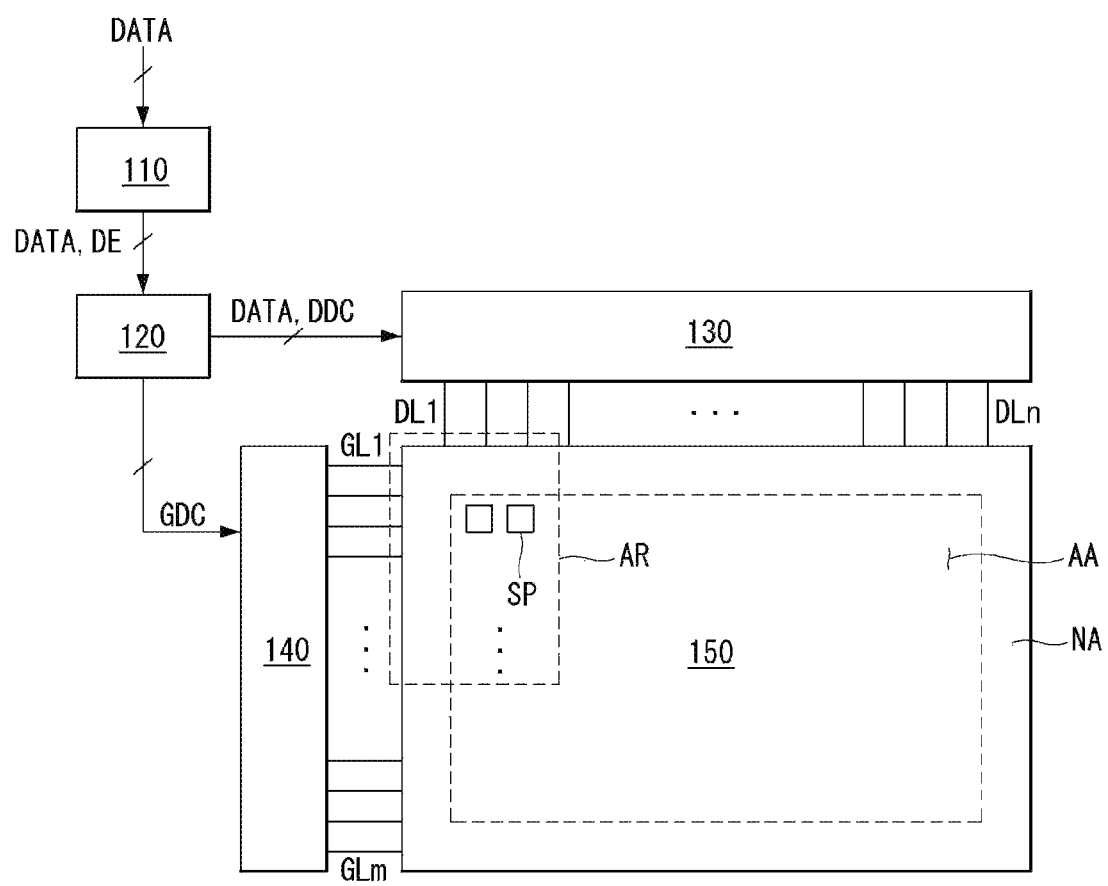
FIG. 2 is a schematic block diagram of an organic light-emitting display device.
Figure 3:
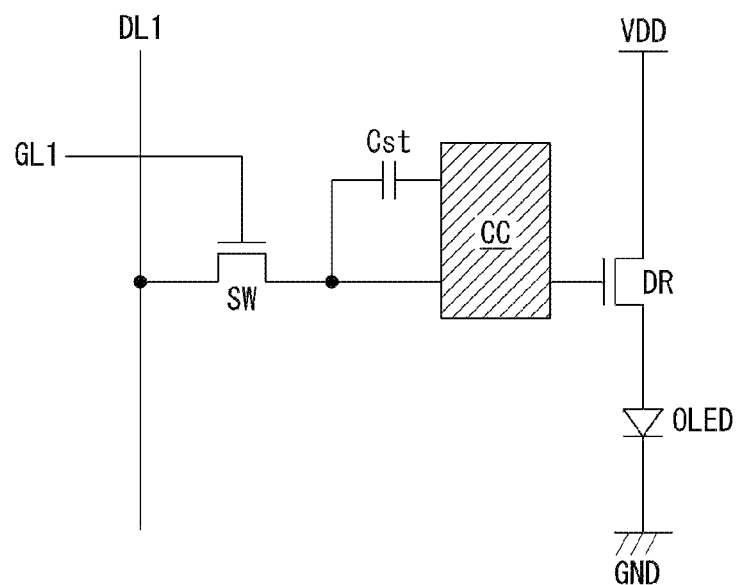
FIGS. 3 and 4 are block diagrams schematically showing a sub-pixel shown in FIG. 2.
Figure 4:
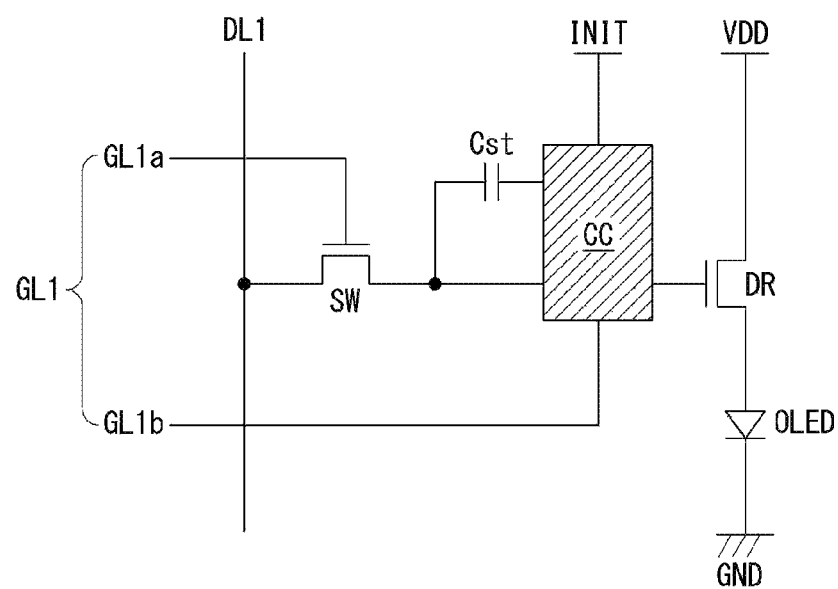

FIG. 2 is a schematic block diagram of an organic light-emitting display device. FIGS. 3 and 4 are block diagrams schematically showing a sub-pixel shown in FIG. 2.

Referring to FIG. 2, the organic light-emitting display device comprises an image processor 110, a timing controller 120, a data driver 130, a gate driver 140, and a display panel 150.

The image processor 110 outputs a data enable signal DE, etc., along with an externally supplied data signal DATA. The image processor 110 may output one or more among a vertical synchronization signal, horizontal synchronization signal, and clock signal, in addition to the data enable signal DE, but these signals are not shown in the drawings for convenience of explanation. The image processor 110 is provided in the form of an IC (integrated circuit) on a system circuit board.

The timing controller 120 receives the data signal DATA from the image processor 110, along with the data enable signal DE or driving signals including the vertical synchronization signal, horizontal synchronization signal, and clock signal.

Based on the driving signals, the timing controller 120 outputs a gate timing control signal GDC for controlling the operation timing of the gate driver 140 and a timing control signal DDC for controlling the operation timing of the data driver 130. The timing controller 120 is provided in the form of an IC on a control circuit board.

In response to the data timing control signal DDC supplied from the timing controller 120, the data driver 130 samples and latches the data signal DATA supplied form the timing controller 120, converts it to a gamma reference voltage, and outputs the gamma reference voltage. The data driver 130 outputs the data signal DATA through data lines DL1 to DLn. The data driver 130 may be formed on a data circuit substrate in the form of an IC and bonded onto the display panel 150.

In response to the gate timing control signal GDC supplied from the timing controller 120, the gate driver 140 outputs a gate signal while shifting the level of a gate voltage. The gate driver 140 outputs the gate signal through gate lines GL1 to GLm. The gate driver 140 may be formed on a gate circuit substrate in the form of an IC, or may be formed on the display panel 150 by a gate-in-panel (GIP) technology.

The display panel 150 comprises a display area AA that displays an image and a non-display area NA surrounding the display area AA. The display area AA comprises sub-pixels SP. The sub-pixels may be defined by the intersections of signal lines.

The display panel 150 displays an image, corresponding to the data signal DATA and gate signal respectively supplied from the data driver 130 and gate driver 140. The non-display area NA comprises pads and link lines. The pad is bonded to a circuit substrate and receives signals form the circuit substrate. The link lines connected to the pads and transfer the signals to the sub-pixels SP in the display area AA.

Referring to FIG. 3, each sub-pixel comprises a switching transistor SW, a driving transistor DR, a compensation circuit CC, and an organic light-emitting diode OLED. The organic light-emitting diode OLED operates to emit light in response to a drive current provided by the driving transistor DR.

In response to a gate signal supplied through the first gate line GL1, the switching transistor SW switches so that a data signal supplied through the first data line DL1 is stored as a data voltage in a capacitor Cst. The driving transistor DR operates so that a driving current flows between a high-level power supply line VDD and a low-level power supply line GND in response to the data voltage stored in the capacitor Cst. The compensation circuit CC is a circuit for compensating for the threshold voltage, etc. of the driving transistor DR. Moreover, the capacitor connected to the switching transistor SW or driving transistor DR may be positioned within the compensation circuit CC.

The compensation circuit CC comprises one or more thin film transistors and a capacitor. The compensation circuit CC has a wide variety of configurations depending on the compensation method, so a detailed illustration and description of this will be omitted.

As shown in FIG. 4, with the addition of the compensation circuit CC, the sub-pixel may further comprise a signal line, power supply line, etc. for supplying a particular signal or power, as well as driving a compensation thin-film transistor. The additional signal line may be defined as a (1-2)th gate line GL1b for driving the compensation thin-film transistor included in the sub-pixel. The additional power supply line may be defined as a reset power supply line INIT for resetting a particular node of the sub-pixel. However, this is merely an example, and the present invention is not limited thereto.

Meanwhile, FIGS. 3 and 4 illustrate a sub-pixel comprising a compensation circuit CC by way of example. However, if a compensating entity is located outside the sub-pixel, such as in the data driver 130, etc., then the compensation circuit CC may be omitted. That is, each sub-pixel may have a 2T(transistor)1C(capacitor) structure comprising a switching transistor SW, a driving transistor DR, a capacitor, and an organic light-emitting diode OLED, or may have various structures like 3T1C, 4T2C, 5T2C, 6T2C, 7T2C, etc., if the compensation circuit CC is added to the sub-pixel.

First Exemplary Embodiment

Figure 5:
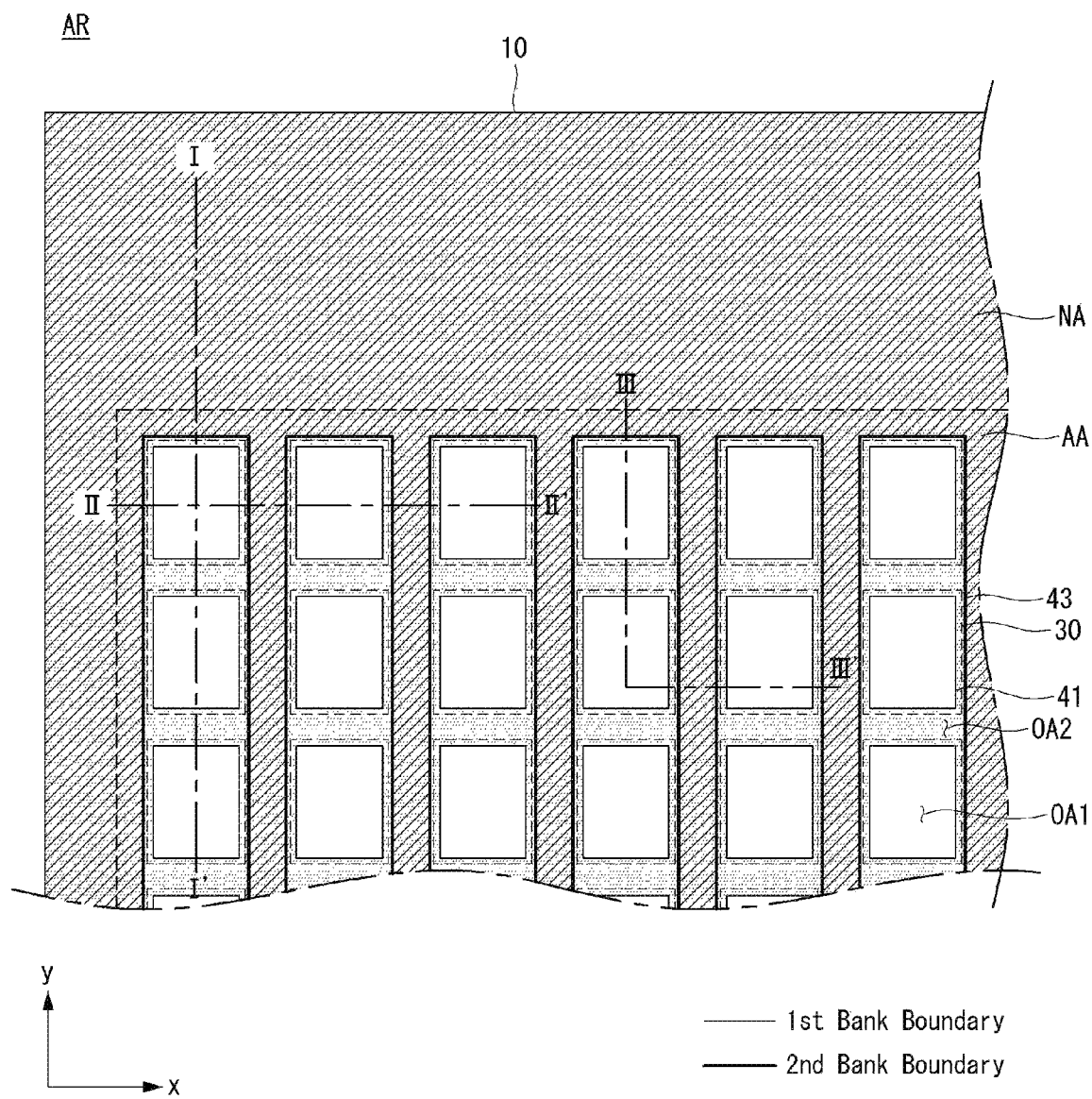
FIG. 5 is a schematic view of an organic light-emitting display device according to a first exemplary embodiment of the present invention, which is an enlarged top plan view of the AR area of FIG. 2.
Figure 6A:
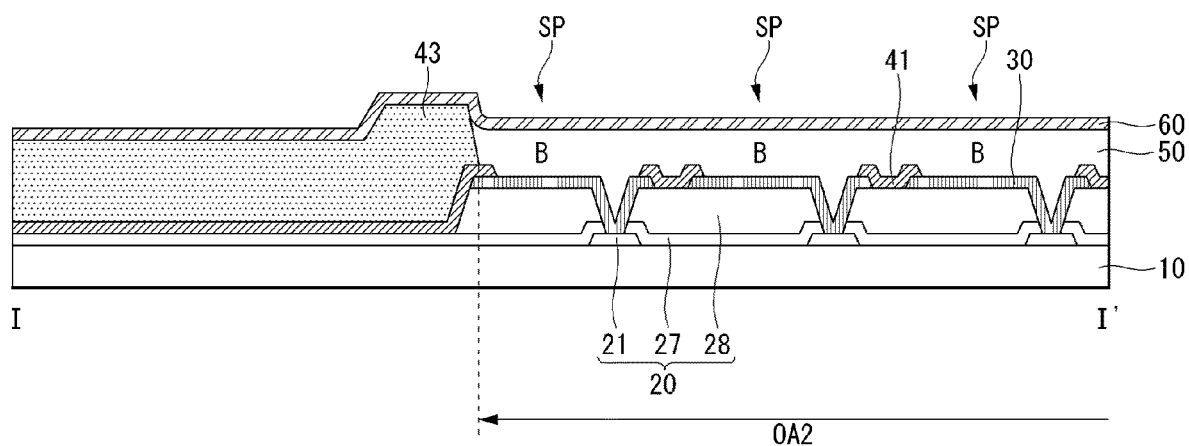
FIGS. 6A and 6B shows cross-sectional views taken along the lines I-I' and II-II' in FIG. 5, respectively.
Figure 6B:
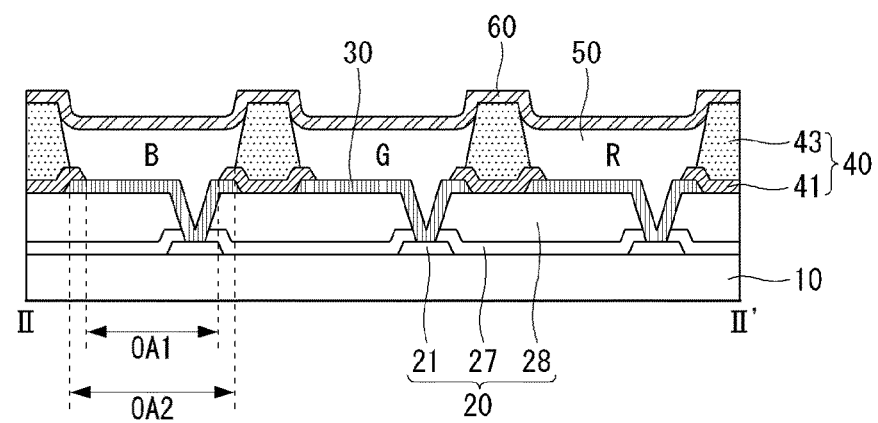

FIG. 5 is a schematic view of an organic light-emitting display device according to a first exemplary embodiment of the present invention, which is an enlarged top plan view of the AR area of FIG. 2. FIGS. 6A and 6B shows cross-sectional views taken along the lines I-I' and II-IP in FIG. 5, respectively.

Referring to FIGS. 5 and 6, the organic light-emitting display device according to the first exemplary embodiment comprises a substrate 10 having a display area AA where sub-pixels SP are arranged and a non-display area NA surrounding the display area AA. The substrate 10 may have various planar shapes, for example, all planar shapes such as square, circular, and elliptical, as well as the rectangular shape shown in the drawings. A first direction (for example, X-axis direction or row direction) and a second direction (for example, Y-axis direction or column direction), which intersect each other, are defined on the substrate 10, regardless of the planar shape of the substrate 10. The positions and arrangements of subpixels and/or openings to be described later may be defined by the first direction and second direction.

A circuit unit 20 and organic light-emitting diodes are placed on the substrate 10. The circuit unit 20 comprises elements for driving organic light-emitting diodes.

Signal lines and electrodes for applying driving signals to the organic light-emitting diodes may be arranged on the circuit unit 20, and the signal lines and the electrodes may be placed separately with at least one insulating layer between them if necessary. If the organic light-emitting display device is an active matrix (AM) display, the circuit unit 20 may further comprise a transistor 21 allocated for each sub-pixel SP. For convenience of explanation, a description will be given below with an example in which a transistor 21 is allocated for each sub-pixel. In this case, a passivation film 27 and an overcoat layer 28 are interposed between the transistor 21 and the organic light-emitting diode. The passivation film 27 comprises inorganic material and protects internal elements. The overcoat layer 28 comprises predetermined organic material, and may have a predetermined thickness to compensate for step differences caused by the underlying transistors 21 and signal lines.

The organic light-emitting diode comprises a first electrode 30, a second electrode 60, and an organic light-emitting layer 50 interposed between the first electrode 30 and the second electrode 60. The first electrode 30 may be an anode, and the second electrode 60 may be a cathode.

More specifically, the sub-pixels SP may be arranged along first and second directions. The sub-pixels SP located adjacent to each other in the first direction may emit light of different colors, and the sub-pixels SP located adjacent to each other in the second direction may emit light of the same color. The first electrodes 30 of the organic light-emitting diodes are placed on the sub-pixels SP. One first electrode 30 may be allocated for each sub-pixel SP.

A bank 40 is placed on the first electrodes 30. The bank 40 comprises a first bank 41 and a second bank 43.

The first bank 41 is located on the first electrodes 30 to define sub-pixels. The first bank 41 comprises first openings OA1 exposing at least part of the first electrodes 30. One first opening OA1 exposes one first electrode 30. Thus, the number of first openings OA1 and the number of first electrodes 30 may be equal.

The first bank 41 may be made relatively thin so as to be covered by the organic light-emitting layer 40. The first bank 41 may be hydrophilic. In an example, the first bank 41 may be formed of a hydrophilic, inorganic insulating material such as silicon oxide (SiO$_2$) or silicon nitride (SiNx).

Although the drawings illustrate that the first openings OA1 are approximately rectangular, they are not limited to this shape. Also, the drawings illustrate that all of the first openings OA1 have the same shape and area, but they are not limited to this and at least one first opening OA1 may have a different shape and/or area from another first opening OA1. For example, the shape and/or area of the first openings OA1 may be properly selected in view of the lifetime of organic light-emitting materials for forming the organic light-emitting layer 50 of the organic light-emitting diodes. The parts of the first electrodes 30 exposed by the first openings OA1 may be defined as light-emitting regions.

The second bank 43 is placed on the substrate 10 where the first bank 41 is formed. The second bank 43 is a barrier wall that separates adjacent lines (e.g. columns) of sub-pixels. The second bank 43 comprises second openings OA2 exposing at least part of the first electrode 30. A plurality of second openings OA2 are arranged in parallel in the first direction, and extend in the second direction. The second opening OA2 extending in the second direction expose a plurality of the first electrodes 30 arranged along the second direction. Alternatively, the second openings OA2 extending in the second direction expose the first openings OA1 arranged along the second direction.

The second bank 43 may be hydrophobic. Alternatively, the second bank 43 may be hydrophobic on the top and hydrophilic on the side. In an example, the second bank 43 may be formed with a hydrophobic material coated on an insulating material or formed with an insulating material containing a hydrophobic material. The second bank 43 may be made of organic material. The hydrophobic nature of the second bank 43 may allow the organic light-emitting material constituting the organic light-emitting layer 50 to be pushed to and collected at the center of the light-emitting region. Also, the second bank 43 may function as a barrier that encloses the organic light-emitting material dropped into that region, so as to prevent organic light-emitting materials of different colors from being mixed together.

Although the drawings illustrate that the second openings OA2 are approximately rectangular, they are not limited to this shape. Also, the drawings illustrate that all of the second openings OA2 have the same shape and area, but they are not limited to this and at least one second opening OA2 may have a different shape and/or area from another second opening OA2. For example, the shape and/or area of the second openings OA2 may be properly selected in view of the lifetime of organic light-emitting materials.

The second openings OA2 are located on the outside of the first openings OA1, at a distance from them. That is, the boundary of the first bank 41 is spaced a predetermined distance apart from the boundary of the second bank 43. Therefore, the first openings OA1 may be exposed by the second openings OA2.

The organic light-emitting layer 50 is placed on the substrate 10 where the second bank 43 is formed. The organic light-emitting layer 50 may be formed within the corresponding second openings OA2, along the direction in which the second openings OA2 extend. That is, the organic light-emitting material dropped into one second opening OA2 covers the first electrodes 30 and first banks 41 exposed by the second opening OA2, and are not physically separated by the first bank 41.

Organic light-emitting material of the same color is dropped onto the first electrodes 30 exposed by one second opening OA2. This means that the sub-pixels SP allocated to positions corresponding to one second opening OA2 emit light of the same color. The planar shape of the organic light-emitting layer 50 may correspond to the planar shape of the second openings OA2.

Organic light-emitting materials of different colors may be dropped in an alternating fashion into the corresponding second openings OA2. The organic light-emitting materials of different colors may comprise organic light-emitting materials that emit red (R), green (G), and blue (B) light, and if necessary, may further comprise an organic light-emitting material that emits white (W) light.

The second bank 43 is located between the first electrodes 30 adjacent to each other in the first direction, so that the organic light-emitting materials of different colors, dropped into the corresponding second openings OA2 adjacent to each other in the first direction, are prevented from being mixed together. That is, the organic light-emitting materials of different colors dropped into different second openings OA2 are physically separated by the second bank 43.

The organic light-emitting material used to form the organic light-emitting layer 50 in the solution process is dropped in such a way as to cover at least part of the first electrodes 30, part of the first bank 41, and part of the second bank 43. The first bank 41 is hydrophilic, which facilitates wetting and spreading of the organic light-emitting material onto the first electrodes 30, even if the first electrodes 30 is hydrophobic. The second bank 43 is a hydrophobic thick film that can push the hydrophilic organic light-emitting material to the center. By the combined structure of the first bank 41 and the second bank 43, the organic light-emitting layer 50 may be formed with a relatively uniform thickness in the light-emitting regions.

In a case where each of the second openings OA2 exposes one first electrode 30, the thickness of the organic light-emitting material dropped into each of the second openings OA2 may differ depending on variance in the equipment of the solution process. The variances in the equipment may refer to varying spray rates between nozzles of inkjet equipment. That is, the spray rates of nozzles used to drop organic light-emitting material onto the second openings OA2 may not be constant. In this case, the thickness of the organic light-emitting material dropped into each of the sub-pixels SP through the nozzles allocated for one sub-pixel SP may vary with position.

In the present invention, a plurality of sub-pixels SP may be allocated within one second opening OA2, and a plurality of nozzles corresponding to the number of sub-pixels SP may be allocated within it. This compensates for the varying spray rates between the nozzles, and therefore the organic light-emitting materials dropped into the second openings OA2 may have uniform thickness.

Accordingly, the organic light-emitting display device according to the present invention may prevent deterioration in the uniformity of the organic light-emitting layer 50, thereby preventing a decrease in display quality due to the thickness deviation of the organic light-emitting layer 50 in the sub-pixels SP. Moreover, a decline in the device's lifetime or imperfections like dark spot formation may be prevented or reduced by ensuring that the organic light-emitting layer 50 is uniform.

The aforementioned predetermined distance between the boundary of the first bank 41 and the boundary of the second bank 43 refers to the minimum distance at which the organic light-emitting layer 40 can have uniform thickness. If the distance between the boundary of the first bank 41 and the boundary of the second bank 43 is shorter than the predetermined distance, the organic light-emitting layer 50 cannot be made uniform. If the distance between the boundary of the first bank 41 and the boundary of the second bank 43 is longer than the predetermined distance, the area of the first electrodes 30 which are covered by the first bank 41 increases, which can cause problems such as a small aperture ratio.

In the organic light-emitting display device according to the present invention, the second openings OA2 of the second bank 43 extend along the second direction, so that the second bank 43 is not located between the sub-pixels SP adjacent to each other in the second direction. Hence, in the present invention, the aforementioned position constraints on the first bank 41 become relatively loose, thereby improving the degree of design freedom and providing wide light-emitting regions on the first electrodes 30. Therefore, the present invention may enable more flexibility in terms of design variations to ensure a sufficiently large aperture ratio.

Moreover, in a high-resolution display device, the area of the sub-pixels SP is relatively reduced. In this case, organic light-emitting material not dropped to its proper position may cause mixing of different colors of the organic light-emitting layer 50 resulting in a color mixing defect. The present invention has the advantage of improving such a color mixing defect, because organic light-emitting material is dropped onto a sufficiently large area in the second openings OA2 corresponding to the sub-pixels SP.

Figure 7:
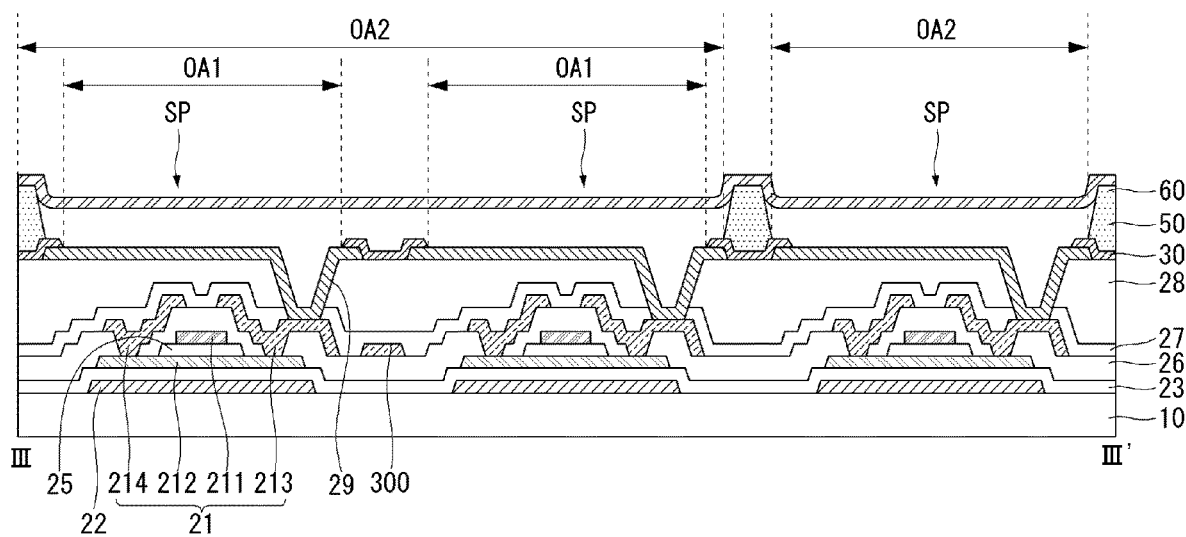
FIG. 7 shows a cross-sectional view taken along the line in FIG. 5.

FIG. 7 shows a cross-sectional view taken along the line in FIG. 5. Referring to FIG. 7, the circuit unit 20 and the organic light-emitting diodes placed on the circuit unit 20 are placed on the substrate 10. The circuit unit 20 may comprise transistors 21 electrically connected to the organic light-emitting diodes. In an example, a light shielding layer 22 is placed on the substrate 10. The light shielding layer 22 shields light coming from the outside and prevents sensitized photocurrent from being generated in the transistors 21. A buffer layer 23 is placed on the light shielding layer 22. The buffer layer 23 serves to protect thin-film transistors formed in a subsequent process from impurities such as alkali ions leaking out of the first substrate SUB1. The buffer layer 23 may be a silicon oxide (SiOx), a silicon nitride (SiNx), or multiple layers of these compounds.

A semiconductor layer 212 of the transistors 21 is placed on the buffer layer 23, and a capacitor lower electrode 24 is located apart from it. The semiconductor layer 212 and the capacitor lower electrode 24 may be formed of silicon semiconductor or oxide semiconductor. The silicon semiconductor may comprise amorphous silicon or crystallized polycrystalline silicon. The semiconductor layer 212 comprises a drain region and a source region each including p-type or n-type impurities, and also comprises a channel between the drain region and the source region. The capacitor lower electrode 24 may become conductive by being doped with impurities.

A gate insulating film 25 is placed on the semiconductor layer 212 and the capacitor lower electrode 24. The gate insulating film 25 may be silicon oxide SiOx, silicon nitride SiNx, or multiple layers of these compounds. A gate electrode 211 is placed on the gate insulating film 25, corresponding to a certain area of the semiconductor layer 212, that is, a channel for injecting an impurity. The gate electrode 211 may be made up of any one selected from the group consisting of molybdenum (Mo), aluminum (Al), chrome (Cr), gold (Au), titanium (Ti), nickel (Ni), neodymium (Nd), and copper (Cu) or multiple layers of alloys of these elements. Further, the gate electrode 211 may be a multilayer formed of one of molybdenum (Mo), aluminum (Al), chrome (Cr), gold (Au), titanium (Ti), nickel (Ni), neodymium (Nd), copper (Cu), or alloys of these elements. For example, the gate electrode 211 may consist of dual layers of molybdenum/aluminum-neodymium or molybdenum/aluminum.

An interlayer insulating film 26 for insulating the gate electrode 211 is placed on the gate electrode 211. The interlayer insulating film 26 may be a silicon oxide film (SiOx), a silicon nitride film (SiNx), or multiple layers of these compounds. A drain electrode 213 and a source electrode 214 are placed on the interlayer insulating film 26. The drain electrode 213 and the source electrode 214 are connected to the semiconductor layer 212 via contact holes exposing the source region of the semiconductor layer 212. The source electrode 213 and the drain electrode 214 may consist of a single layer or multiple layers. If the source electrode 213 and the drain electrode 214 consist of a single layer, they may be made up of any one selected from the group consisting of molybdenum (Mo), aluminum (Al), chrome (Cr), gold (Au), titanium (Ti), nickel (Ni), neodymium (Nd), and copper (Cu), or an alloy of these elements. On the other hand, if the source electrode 213 and the drain electrode 214 consist of multiple layers, they may be made up of two layers of molybdenum/aluminum-neodymium or three layers of titanium/aluminum/titanium, molybdenum/aluminum/molybdenum, or molybdenum/aluminum-neodymium/molybdenum. As such, a transistor 21 comprising the semiconductor layer 212, the gate electrode 211, the drain electrode 213, and the source electrode 214 is formed. Also, the drain electrode 214, which serves as a capacitor upper electrode, and the capacitor lower electrode 24 constitute a capacitor Cst.

A passivation film 27 is placed on the substrate 10 comprising the transistors 21 and the capacitor Cst. The passivation film 27 is an insulating film that protects the underlying elements, and may be a silicon oxide film (SiOx), a silicon nitride film (SiNx), or multiple layers of these compounds. An overcoat layer 28 is placed on the passivation film 27. The overcoat layer 28 may be a planarization film for smoothing out step differences on the underlying structure, and is made of an organic material such as polyimide, benzocyclobutene-based resin, acrylate, etc. Sub-pixel contact holes 29 are located in some region of the overcoat layer 28, which expose the source electrode 213 by exposing the passivation film 27.

The organic light-emitting diodes are placed on the overcoat layer 28. Each organic light-emitting diode comprises a first electrode 30 connected to a transistor, a second electrode 60 facing the first electrode 30, and the organic light-emitting layer 50 interposed between the first electrode 30 and the second electrode 60. The first electrode 30 may be an anode, and the second electrode 60 may be a cathode.

The first electrodes 30 are placed on the overcoat layer 28, and may be connected to the source electrodes 213 of the transistors through sub-pixel contact holes 29 penetrating the overcoat layer 28. One first electrode 30 may be allocated for each sub-pixel, but not limited thereto. The first electrode 30 may be made of a transparent conductive material, for example, ITO (indium tin oxide), IZO (indium zinc oxide), or ZnO (zinc oxide) according to a selected emission method and function as a transmissive electrode, or may include a reflective layer and function as a reflective electrode. The reflective layer may be made of aluminum (Al), copper (Cu), silver (Ag), nickel (Ni), or an alloy of these elements, preferably, APC (silver/palladium/copper alloy).

A bank 40 is placed on the substrate 10 where the first electrodes 30 are formed. The bank 40 comprises a first bank 41 and a second bank 43. The first bank 41 and the second bank 43 comprise openings that expose most of the first electrodes 30.

The organic light-emitting layer 50 is placed on the substrate 10 where the bank 40 is formed. The organic light-emitting layer 50 may further comprise one or more of an emission layer EML, a hole injection layer HIL, a hole transport layer HTL, an electron transport layer ETL, and an electron injection layer EIL. The bank 40 comprises a first bank 41 and a second bank 43.

The first bank 41 comprises first openings OA1 that expose a plurality of first electrodes 30 arranged in the first direction. The second bank 43 comprises second openings OA2 that expose a plurality of first electrodes 30 arranged in a second direction.

Signal lines 300 may be placed in the area where the first bank 41 is placed and the area where the second bank 43 is placed. The signal lines 300 are connected to the transistors 21 and apply driving signals to the corresponding sub-pixels. The signal lines 300 may comprise gate lines for applying gate signals to the sub-pixels, data lines for applying data signals to the sub-pixels, high-level power supply lines for applying high-level power to the sub-pixels, and low-level power supply lines for applying low-level power to the sub-pixels. For example, in instances where compensation circuits are added to the sub-pixels, the signal lines 300 may further comprise sensing lines for sensing the electrical characteristics of the sub-pixels.

The signal lines 300 may be positioned to overlap the first bank 41, and extend across the first electrodes 30 adjacent to each other in the first direction. And/or, the signal lines 300 may be positioned to overlap the second bank 43, and extend across the first electrodes 30 adjacent to each other in the second direction.

The signal lines 300 may be formed on different layers, with at least one insulating layer 23, 26, 27, and 28 in between, in the regions corresponding to the first bank 41 and/or second bank 43. For example, the gate lines may be placed on the same layer as the gate electrodes 211. The data lines, high-level power supply lines, and low-level power supply lines may be placed on the same layer as the source/drain electrodes 213 and 214. The sensing lines may be placed on the same layer as the source/drain electrodes 213 and 214 or on the same layer as the light shielding layer 22. If necessary, any one of the signal lines 300 may be segmented into a plurality of lines placed on different layers, and these line segments may be electrically connected through contact holes penetrating the insulating layer placed between them.

The second electrodes 60 are placed on the organic light-emitting layer 50. The second electrodes 60 may be formed widely over the entire surface of the substrate 10. The second electrodes 60 may function as transmissive electrodes or reflective electrodes according to a selected emission method. If the second electrodes 60 are transmissive electrodes, the second electrodes 60 may be made of a transparent conductive material, such as ITO (indium tin oxide), IZO (indium zinc oxide), or ZnO (zinc oxide), and may be made of magnesium (Mg), calcium (Ca), aluminum (Al), silver (Ag), or an alloy thereof that is thin enough to pass light through.

Figure 8:
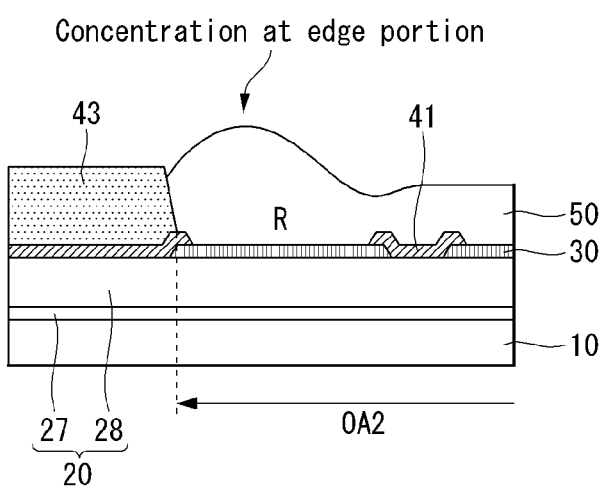
FIG. 8 is a view for explaining problems that may occur due to difference in the drying speed of organic light-emitting material with respect to position.

FIG. 8 is a view for explaining problems that may occur due to difference in the drying speed of organic light-emitting material with respect to position. Referring to FIG. 8, organic light-emitting material is dropped into the second openings OA2. The dropped organic light-emitting material may spread widely so that its thickness is relatively uniform in a wide region. However, as shown in the drawing, the organic light-emitting material may be concentrated at the edge portions of the second openings OA2 due to differences in drying speed in the hardening process. The edge portions refer to opposite ends of the second openings OA2 aligned in the second direction.

More specifically, the internal rate of flow of organic light-emitting material may differ with position, due to the differences in the drying speed of the organic light-emitting material at the edge portions and center portion of the second openings OA2. Due to this, the organic light-emitting layer 50 formed after the drying process is not uniform in thickness in some parts, and may be made thick at the edge portions where the drying speed is relatively high, causing a thickness defect.

That is, the high drying speed of the organic light-emitting material at the edges may cause solid content to be moved toward the edges and concentrated there due to the differences in internal rate of flow. Therefore, the organic light-emitting layer 50 has non-uniform thickness at the edges, which is seen as edge blurring to the user and results in a deterioration in display quality.

Second Exemplary Embodiment

Figure 9:
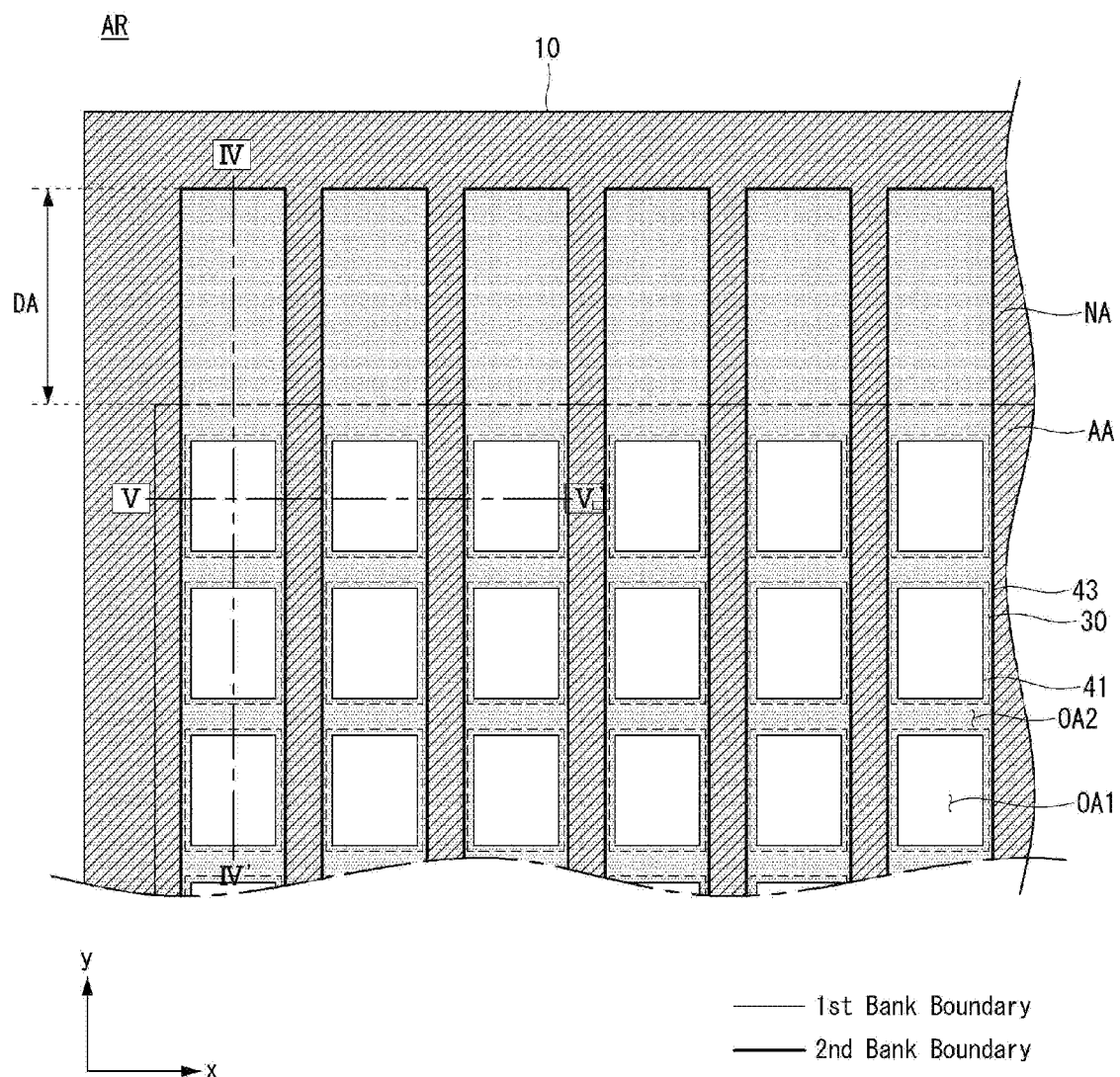
FIG. 9 is a schematic view of an organic light-emitting display device according to a second exemplary embodiment of the present invention, which is an enlarged top plan view of the AR area of FIG. 2.
Figure 10A:
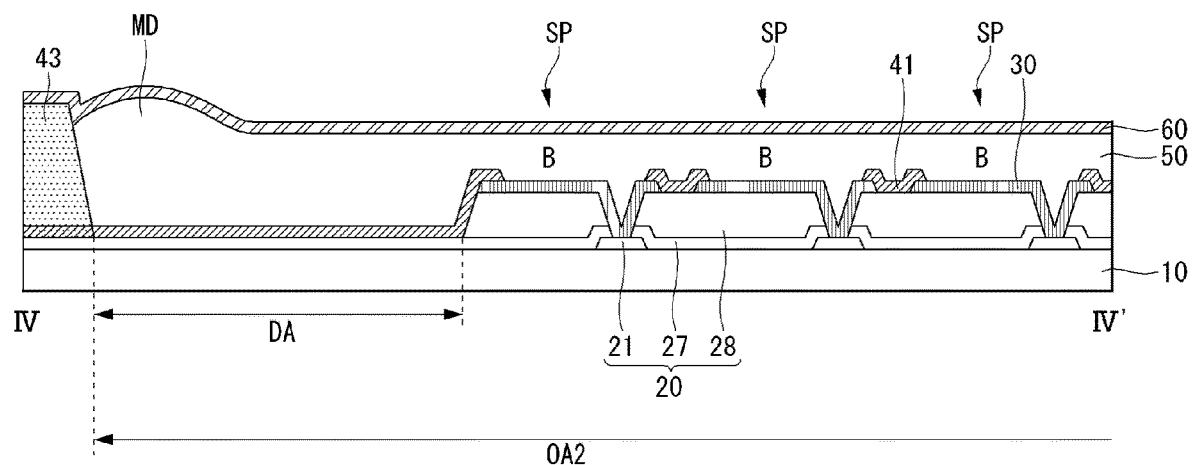
FIGS. 10A and 10B show cross-sectional views taken along the lines IV-IV' and V-V' in FIG. 9, respectively.
Figure 10B:
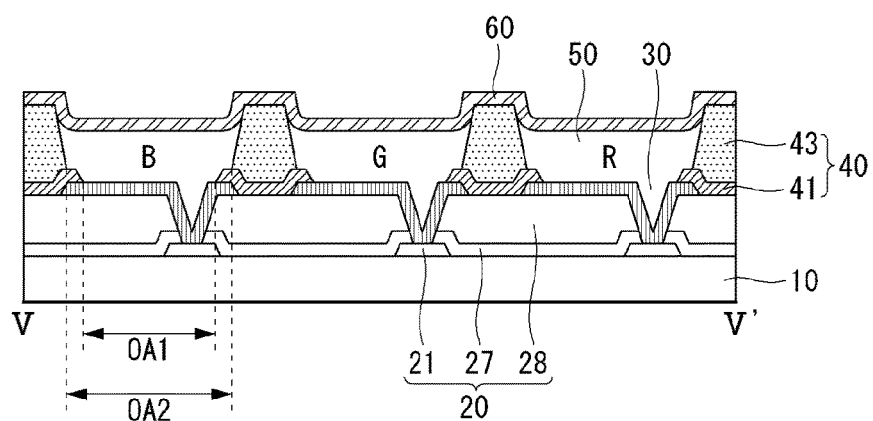

FIG. 9 is a schematic view of an organic light-emitting display device according to a second exemplary embodiment of the present invention, which is an enlarged top plan view of the AR area of FIG. 2. FIGS. 10A and 10B show cross-sectional views taken along the lines IV-IV' and V-V' in FIG. 9, respectively.

Referring to FIGS. 9, 10A and 10B, the organic light-emitting display device according to the second exemplary embodiment comprises a substrate 10 having a display area AA where sub-pixels SP are arranged and a non-display area NA surrounding the display area AA. The substrate 10 may have various planar shapes, for example, all planar shapes such as square, circular, and elliptical, as well as the rectangular shape shown in the drawings. A first direction (for example, X-axis direction) and a second direction (for example, Y-axis direction), which intersect each other, are defined on the substrate 10, regardless of the planar shape of the substrate 10. The positions and arrangements of subpixels and/or openings to be described later may be defined by the first direction and second direction.

A circuit unit 20 and organic light-emitting diodes are placed on the substrate 10. The circuit unit 20 comprises elements for driving organic light-emitting diodes.

Signal lines and electrodes for applying driving signals to the organic light-emitting diodes may be arranged on the circuit unit 20, and the signal lines and the electrodes may be placed separately with at least one insulating layer between them if necessary. If the organic light-emitting display device is an active matrix (AM) display, the circuit unit 20 may further comprise a transistor 21 allocated for each sub-pixel SP. Below, a description will be given with an example in which a transistor 21 is allocated for each sub-pixel for convenience of explanation. In this case, a passivation film 27 and an overcoat layer 28 are interposed between the transistor 21 and the organic light-emitting diode. The passivation film 27 comprises inorganic material and protects internal elements. The overcoat layer 28 comprises predetermined organic material, and may have a predetermined thickness to compensate for step differences caused by the underlying transistors 21 and signal lines.

As shown in (a) of FIG. 10, the overcoat layer 28 may be patterned at the boundary between the display area AA and the non-display area NA. That is, the overcoat layer 28 may be left in the display area AA and removed from the non-display area NA. The overcoat layer 28 may produce an out-gas at a high temperature. The out-gas can be a problem because it may deteriorate the organic light-emitting diodes. Especially, even the organic light-emitting diodes allocated to the sub-pixels adjacent to the non-display area NA are affected by the out-gas produced from the overcoat layer 28 left in the non-display area NA. To prevent this, the overcoat layer 28 in the non-display area NA may be removed by patterning. Also, the overcoat layer 28, which is made of an organic material, may serve as a path through which oxygen and moisture coming from outside the substrate 10 are introduced. The introduced oxygen and moisture can be a problem because they may deteriorate the internal elements in the display area AA. To prevent this, in the second exemplary embodiment of the present invention, the path of moisture and oxygen may be blocked by removing the overcoat layer 28 in the non-display area NA.

The organic light-emitting diode comprises a first electrode 30, a second electrode 60, and an organic light-emitting layer 50 interposed between the first electrode 30 and the second electrode 60. The first electrode 30 may be an anode, and the second electrode 60 may be a cathode.

More specifically, the sub-pixels SP may be arranged along first and second directions. The sub-pixels SP located adjacent to each other in the first direction may emit light of different colors, and the sub-pixels SP located adjacent to each other in the second direction may emit light of the same color. The first electrodes 30 of the organic light-emitting diodes are placed on the sub-pixels SP. One first electrode 30 may be allocated for each sub-pixel SP.

A bank 40 is placed on the first electrodes 30. The bank 40 comprises a first bank 41 and a second bank 43.

The first bank 41 is located on the first electrodes 30. The first bank 41 comprises first openings OA1 exposing at least part of the first electrodes 30. One first opening OA1 exposes one first electrode 30. Thus, the number of first openings OA1 and the number of first electrodes 30 may be equal.

The first bank 41 may be made relatively thin so as to be covered by the organic light-emitting layer 40. The first bank 41 may be hydrophilic. In an example, the first bank 41 may be formed of a hydrophilic, inorganic insulating material such as silicon oxide ($SiO_2$) or silicon nitride ($SiN_x$).

Although the drawings illustrate that the first openings OA1 are approximately rectangular, they are not limited to this shape. Also, the drawings illustrate that all of the first openings OA1 have the same shape and area, but they are not limited to this and at least one first opening OA1 may have a different shape and/or area from another first opening OA1. For example, the shape and/or area of the first openings OA1 may be properly selected in view of the lifetime of organic light-emitting materials for forming the organic light-emitting layer 50 of the organic light-emitting diodes. The parts of the first electrodes 30 exposed by the first openings OA1 may be defined as light-emitting regions.

The non-display area NA may further comprise a dummy area DA. The dummy area DA is an area adjacent from the display area AA in the second direction. The first bank 41 is placed in the display area AA, and extends as far as the dummy area DA. In the dummy area DA, the overcoat layer 28 may not be interposed between the first bank 41 and the substrate 10.

The second bank 43 is placed on the substrate 10 where the first bank 41 is formed. The second bank 43 comprises second openings OA2 exposing at least part of the first electrode 30. A plurality of second openings OA2 are arranged in parallel in the first direction, and extend in the second direction. The second opening OA2 extending in the second direction expose a plurality of the first electrodes 30 arranged along the second direction. Alternatively, the second openings OA2 extending in the second direction expose the first openings OA1 arranged along the second direction.

The second bank 43 may be hydrophobic. Alternatively, the second bank 43 may be hydrophobic on the top and hydrophilic on the side. In an example, the second bank 43 may be formed with a hydrophobic material coated on an insulating material or formed with an insulating material containing a hydrophobic material. The second bank 43 may be made of organic material. The hydrophobic nature of the second bank 43 may allow the organic light-emitting material constituting the organic light-emitting layer 50 to be pushed to and collected at the center of the light-emitting region. Also, the second bank 43 may function as a barrier that encloses the organic light-emitting material dropped into that region, so as to prevent organic light-emitting materials of different colors from being mixed together.

Although the drawings illustrate that the second openings OA2 are approximately rectangular, they are not limited to this shape. Also, the drawings illustrate that all of the second openings OA2 have the same shape and area, but they are not limited to this and at least one second opening OA2 may have a different shape and/or area from another second opening OA2. For example, the shape and/or area of the second openings OA2 may be properly selected in view of the lifetime of organic light-emitting materials.

The second openings OA2 are located on the outside of the first openings OA1, at a distance from them. That is, the boundary of the first bank 41 is spaced a predetermined distance apart from the boundary of the second bank 43. Therefore, the first openings OA1 may be exposed by the second openings OA2.

The second bank 43 is placed in the display area AA, and extends as far as the dummy area DA. The second openings OA2 expose the first electrodes 30 arranged in the display area AA, and expose the first bank 43 that extends as far as the dummy area DA and are placed in the dummy area DA. The dummy area DA is a non-display area NA in which the transistors and the organic light-emitting diodes are not placed. Accordingly, the second openings OA2 expose only the first bank 41 in the dummy area DA. In the second exemplary embodiment of the present invention, the edge portions of the second openings OA2 may be allocated to the non-display area NA by providing the dummy area DA.

The organic light-emitting layer 50 is placed on the substrate 10 where the second bank 43 is formed. The organic light-emitting layer 50 may be formed within the corresponding second openings OA2, along the direction in which the second openings OA2 extend. That is, the organic light-emitting material dropped into one second opening OA2 covers the first electrodes 30 and first banks 41 exposed by the second opening OA2, and are not physically separated by the first bank 41.

Organic light-emitting material of the same color is dropped onto the first electrodes 30 exposed by one second opening OA2. This means that the sub-pixels SP allocated to positions corresponding to one second opening OA2 emit light of the same color. The planar shape of the organic light-emitting layer 50 may correspond to the planar shape of the second openings OA2.

Organic light-emitting materials of different colors may be dropped in an alternating fashion in the corresponding second openings OA2. The organic light-emitting materials of different colors may comprise organic light-emitting materials that emit red (R), green (G), and blue (B) light, and if necessary, may further comprise an organic light-emitting material that emits white (W) light.

The second bank 43 is located between the first electrodes 30 adjacent to each other in the first direction, so that the organic light-emitting materials of different colors, dropped into the corresponding second openings OA2 adjacent to each other in the first direction, are prevented from being mixed together. That is, the organic light-emitting materials of different colors dropped into different second openings OA2 are physically separated by the second bank 43.

As explained in the first exemplary embodiment, the organic light-emitting layer 50 may have non-uniform thickness due to differences in the drying speed of organic light-emitting material at the edge portions of the second openings OA2. However, in the second exemplary embodiment, unlike the first exemplary embodiment, the edge portions of the second openings OA2 may be positioned in the non-display area NA in which input images are not displayed, by adding the dummy area DA. As illustrated in FIG. 10A, the organic light emitting layer 50 has a mound MD or a valley (not shown) at a location adjacent to the second bank 43 in the dummy area DA. However, the organic light-emitting layer 50 may have uniform thickness in the display area AA. Accordingly, the second exemplary embodiment of the present invention has the advantage of significantly improving the decrease in display quality due to the thickness deviation of the organic light-emitting layer 50.

Third Exemplary Embodiment

Figure 11:
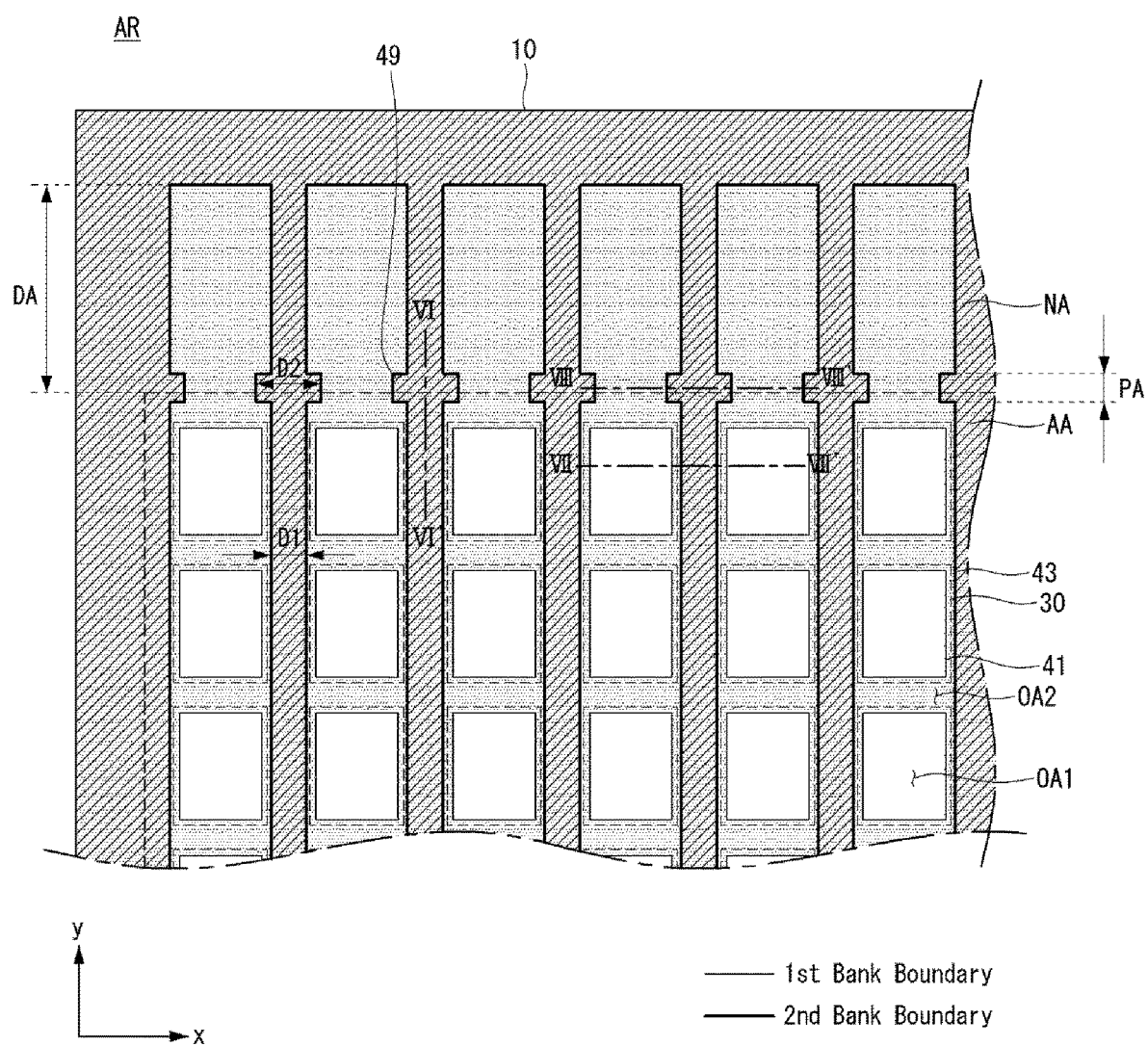
FIG. 11 is a schematic view of an organic light-emitting display device according to a third exemplary embodiment of the present invention, which is an enlarged top plan view of the AR area of FIG. 2.
Figure 12:
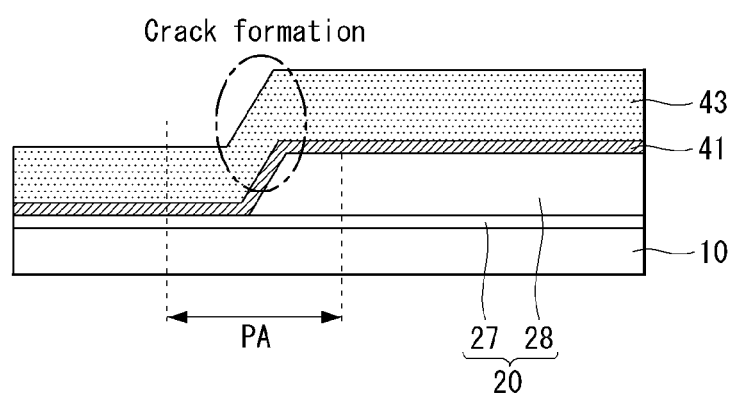
FIG. 12 is a view for explaining the problem of crack formation in a bank due to a step difference on an overcoat layer.

FIG. 11 is a schematic view of an organic light-emitting display device according to a third exemplary embodiment of the present invention, which is an enlarged top plan view of the AR area of FIG. 2. FIG. 12 is a view for explaining the problem of crack formation in a bank due to a step difference on an overcoat layer. FIG. 13 shows cross-sectional views taken along the line VI-VI' in FIG. 11. FIGS. 14A and 14B show cross-sectional views taken along the lines VII-VII' and VIII-VIII' in FIG. 11, respectively. In describing the third exemplary embodiment of the present invention, a description of components that are substantially the same as those in the second exemplary embodiment will be omitted.

Referring to FIG. 11, the organic light-emitting display device according to the third exemplary embodiment comprises a substrate 10 having a display area AA where sub-pixels SP are arranged and a non-display area NA surrounding the display area AA. The substrate 10 may have various planar shapes, for example, all planar shapes such as square, circular, and elliptical, as well as the rectangular shape shown in the drawings. A first direction (for example, X-axis direction) and a second direction (for example, Y-axis direction), which intersect each other, are defined on the substrate 10, regardless of the planar shape of the substrate 10. The positions and arrangements of subpixels and/or openings to be described later may be defined by the first direction and second direction.

A circuit unit 20 and organic light-emitting diodes are placed on the substrate 10. The circuit unit 20 comprises elements for driving organic light-emitting diodes.

Signal lines and electrodes for applying driving signals to the organic light-emitting diodes may be arranged on the circuit unit 20, and the signal lines and the electrodes may be placed separately with at least one insulating layer between them if necessary. If the organic light-emitting display device is an active matrix (AM) display, the circuit unit 20 may further comprise a transistor allocated for each sub-pixel SP. Below, a description will be given with an example in which a transistor is allocated for each sub-pixel for convenience of explanation. In this case, a passivation film 27 and an overcoat layer 28 are interposed between the transistor and the organic light-emitting diode. The passivation film 27 comprises inorganic material and protects internal elements. The overcoat layer 28 comprises predetermined organic material, and may have a predetermined thickness to compensate for step differences caused by the underlying transistors and signal lines.

The overcoat layer 28 may be patterned at the boundary between the display area AA and the non-display area NA. That is, the overcoat layer 28 may be left in the display area AA and removed from the non-display area NA.

However, as shown in FIG. 12, cracks may be formed in the second bank 43 formed on the overcoat layer OC, due to the step differences caused by the patterning of the overcoat layer 28. That is, the second bank 43 may be made relatively thin in a stepped portion PA formed by the patterning of the overcoat layer OC, and therefore cracks may be formed. The stepped portion PA has protrusions 49 that narrows the width of the of the second opening OA2. The second bank 43 may function as a barrier that encloses the organic light-emitting material dropped into the corresponding region. Thus, if cracks are formed in the second bank 43, organic light-emitting materials of different colors dropped into adjacent second openings OA2 may be mixed together—that is, a color mixing defect may occur. Below, a novel rigid structure for preventing cracks will be proposed.

Figure 13A:
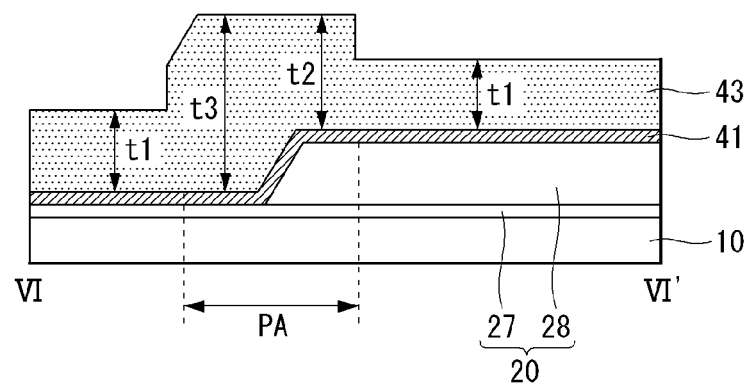
FIGS. 13A and 13B show cross-sectional views taken along the line VI-VI' in FIG. 11.
Figure 13B:
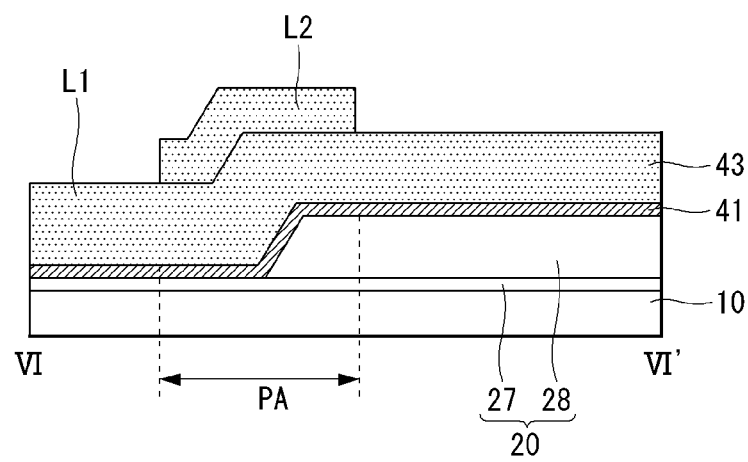
Figure 14A:
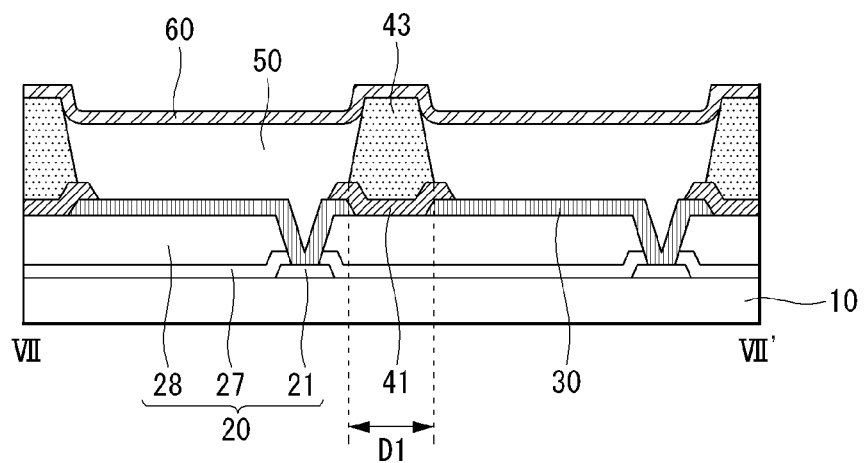
FIGS. 14A and 14B show cross-sectional views taken along the lines VII-VII' and VIII-VIII' in FIG. 11.
Figure 14B:
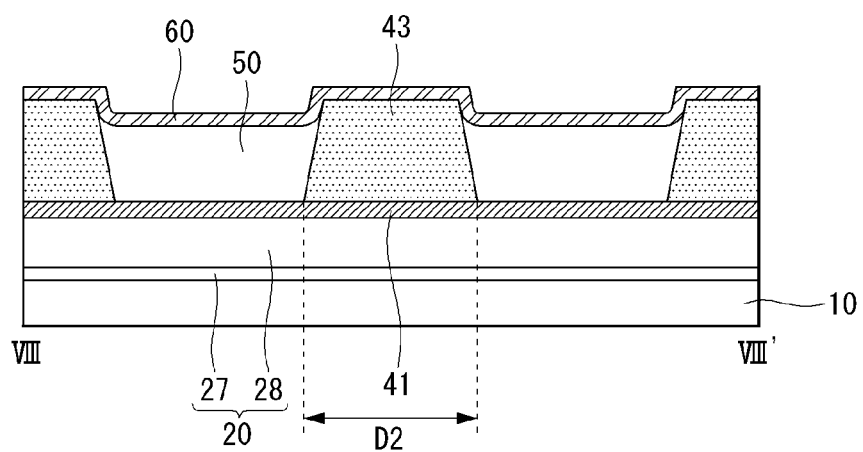

Referring to FIGS. 13A and 13B, the second bank 43 may have a larger thickness in the stepped portion PA than in other areas. That is, the second bank 43 may have a first thickness t1 in the display area AA and/or dummy area DA away from the stepped portion PA and have a second thickness t2 in the stepped portion PA where the overcoat 28 is present and a third thickness t3 in the stepped portion PA where the overcoat 28 is abasent. Here, the second thickness t2 is greater than the first thickness t1. The third thickness t3 is thicker than the second thickness t2. In the third exemplary embodiment of the present invention, the second bank 43 is made relatively thick in the stepped portion PA, thereby effectively preventing cracks. Accordingly, the third exemplary embodiment of the present invention has the advantage of significantly improving the color mixing defect.

In an example, as shown in FIG. 13A, the second bank 43 may be formed with different thicknesses through one deposition process using a multi-tone (or half-tone) mask. In another example, as shown in FIG. 13B, the second bank 43 of different thicknesses may be formed by forming a first layer L1 and then stacking a second layer L2 only in the stepped portion PA. As such, the second bank 43 may have a stacked multilayer structure in the stepped portion PA and have a single-layer structure in other areas.

Referring to FIGS. 14A and 14B, the second bank 43 may have a larger width in the stepped portion PA than in other areas. The second bank 43 may have a first width D1 in the display area AA and dummy area DA, as shown in FIG. 14A. The second bank 43 has a second width D2 in an area corresponding to the stepped portion PA, as shown in FIG. 14B. Here, the second width D2 is greater than the first width DE In another example, the second bank 43 may have the first width D1 in the display area AA and have the second width D2 in the dummy area DA comprising the stepped portion PA. Here, the second width D2 is greater than the first width D1.

In the third exemplary embodiment of the present invention, the second bank 43 is made relatively wide in the stepped portion PA, thereby effectively preventing cracks. Accordingly, the third exemplary embodiment of the present invention has the advantage of significantly improving the color mixing defect.

Fourth Exemplary Embodiment

Figure 15:
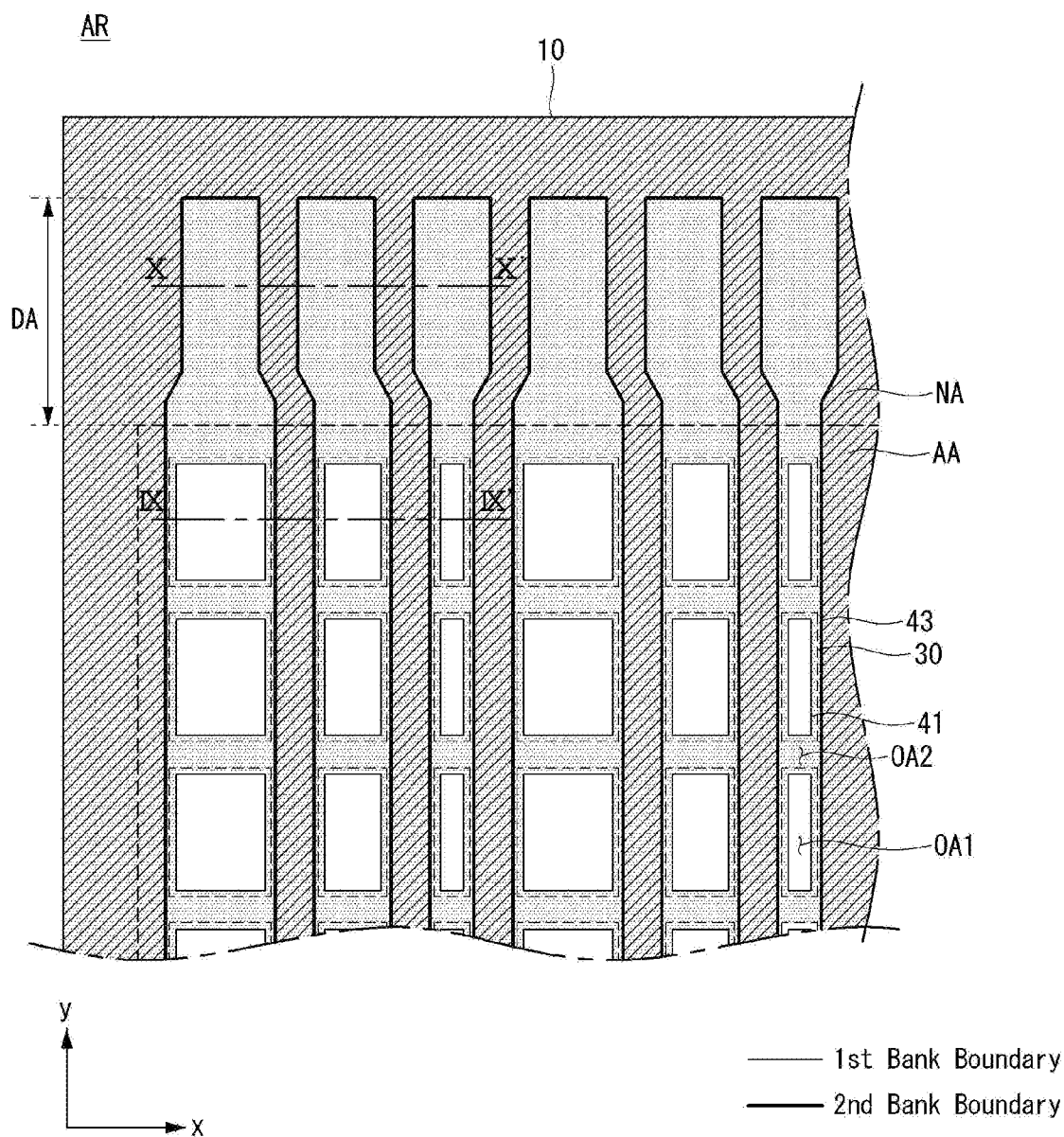
FIG. 15 is a schematic view of an organic light-emitting display device according to a fourth exemplary embodiment of the present invention, which is an enlarged top plan view of the AR area of FIG. 2.
Figure 16A:
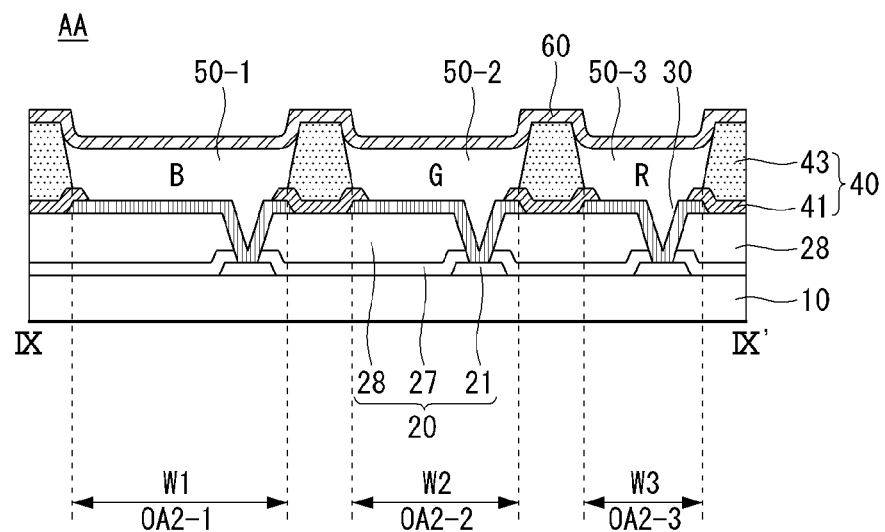
FIGS. 16A and 16B show cross-sectional views taken along the lines IX-IX' and X-X' in FIG. 15, respectively.
Figure 16B:
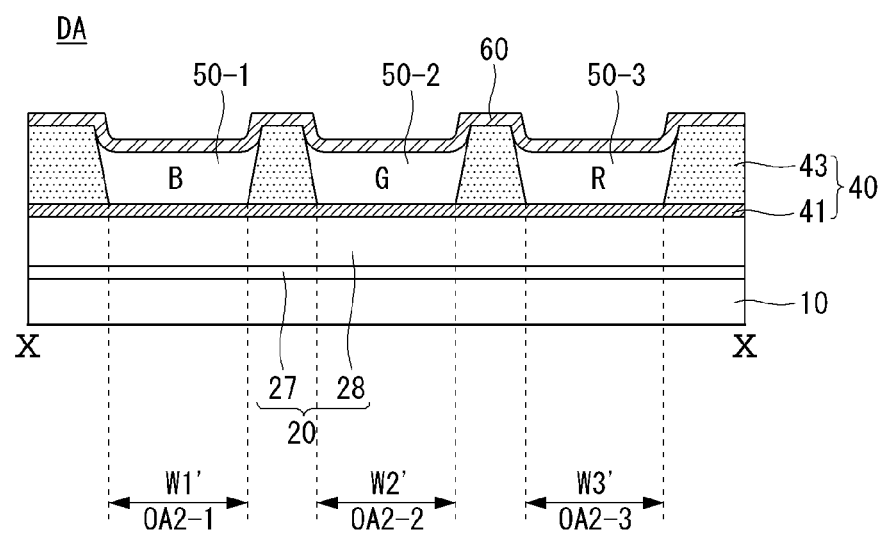

FIG. 15 is a schematic view of an organic light-emitting display device according to a fourth exemplary embodiment of the present invention, which is an enlarged top plan view of the AR area of FIG. 2. FIGS. 16A and 16B show cross-sectional views taken along the lines IX-IX' and X-X' in FIG. 15, respectively. In describing the fourth exemplary embodiment of the present invention, a description of components that are substantially the same as those in the second exemplary embodiment will be omitted.

Referring to FIGS. 15 and 16, the organic light-emitting display device according to the fourth exemplary embodiment comprises a substrate 10 having a display area AA where sub-pixels SP are arranged and a non-display area NA surrounding the display area AA. The substrate 10 may have various planar shapes, for example, all planar shapes such as square, circular, and elliptical, as well as the rectangular shape shown in the drawings. A first direction (for example, X-axis direction) and a second direction (for example, Y-axis direction), which intersect each other, are defined on the substrate 10, regardless of the planar shape of the substrate 10. The positions and arrangements of subpixels and/or openings to be described later may be defined by the first direction and second direction.

A circuit unit 20 and organic light-emitting diodes are placed on the substrate 10. The circuit unit 20 comprises elements for driving organic light-emitting diodes.

Signal lines and electrodes for applying driving signals to the organic light-emitting diodes may be arranged on the circuit unit 20, and the signal lines and the electrodes may be placed separately with at least one insulating layer between them if necessary. If the organic light-emitting display device is an active matrix (AM) display, the circuit unit 20 may further comprise a transistor 21 allocated for each sub-pixel SP. Below, a description will be given with an example in which a transistor 21 is allocated for each sub-pixel for convenience of explanation. In this case, a passivation film 27 and an overcoat layer 28 are interposed between the transistor 21 and the organic light-emitting diode. The passivation film 27 comprises inorganic material and protects internal elements. The overcoat layer 28 comprises predetermined organic material, and may have a predetermined thickness to compensate for step differences caused by the underlying transistors 21 and signal lines.

The organic light-emitting diode comprises a first electrode 30, a second electrode 60, and an organic light-emitting layer 50 interposed between the first electrode 30 and the second electrode 60. The first electrode 30 may be an anode, and the second electrode 60 may be a cathode.

A bank 40 is placed on the first electrodes 30. The bank 40 comprises a first bank 41 and a second bank 43.

The first bank 41 is located on the first electrodes 30. The first bank 41 comprises first openings OA1 exposing at least part of the first electrodes 30. One first opening OA1 exposes one first electrode 30. Thus, the number of first openings OA1 and the number of first electrodes 30 may be equal.

The non-display area NA may further comprise a dummy area DA. The dummy area DA is an area adjacent from the display area AA in the second direction. The first bank 41 is placed in the display area AA, and extends as far as the dummy area DA. In the dummy area DA, the overcoat layer 21 may not be interposed between the first bank 41 and the substrate 10.

The second bank 43 is placed on the substrate 10 where the first bank 41 is formed. The second bank 43 comprises second openings OA2 exposing at least part of the first electrode 30. A plurality of second openings OA2 are arranged in parallel in the first direction, and extend in the second direction. The second opening OA2 extending in the second direction expose a plurality of the first electrodes 30 arranged along the second direction. Alternatively, the second openings OA2 extending in the second direction expose the first openings OA1 arranged along the second direction.

The second openings OA2 are located on the outside of the first openings OA1, at a distance from them. That is, the boundary of the first bank 41 is spaced a predetermined distance apart from the boundary of the second bank 43. Therefore, the first openings OA1 may be exposed by the second openings OA2.

The second bank 43 is placed in the display area AA, and extends as far as the dummy area DA. The second openings OA2 expose the first electrodes 30 arranged in the display area AA, and expose the first bank 43 that extends as far as the dummy area DA and are placed in the dummy area DA. The dummy area DA is a non-display area NA in which the transistors and the organic light-emitting diodes are not placed. Accordingly, the second openings OA2 expose only the first bank 41 in the dummy area DA. In the fourth exemplary embodiment of the present invention, the edge portions of the second openings OA2 may be allocated to the non-display area NA by providing the dummy area DA.

The organic light-emitting layer 50 is placed on the substrate 10 where the second bank 43 is formed. The organic light-emitting layer 50 may be formed within the corresponding second openings OA2, along the direction in which the second openings OA2 extend. That is, the organic light-emitting material dropped into one second opening OA2 covers the first electrodes 30 and first banks 41 exposed by the second opening OA2, and are not physically separated by the first bank 41.

The second bank 43 is located between the first electrodes 30 adjacent to each other in the first direction, so that the organic light-emitting materials of different colors, dropped into the corresponding second openings OA2 adjacent to each other in the first direction, are kept from being mixed together. That is, the organic light-emitting materials of different colors dropped into different second openings OA2 are physically separated by the second bank 43.

As explained in the first exemplary embodiment, the organic light-emitting layer 50 may have non-uniform thickness due to differences in the drying speed of organic light-emitting material at the edge portions of the second openings OA2. However, in the fourth exemplary embodiment, unlike the first exemplary embodiment, the edge portions of the second openings OA2 may be positioned in the non-display area NA in which input images are not displayed, by adding the dummy area DA. In this case, the dropped organic light-emitting material may spread as far as the dummy area DA. Thus, the organic light-emitting layer 50 may have uniform thickness at least in the display area AA. Accordingly, the fourth exemplary embodiment of the present invention has the advantage of significantly improving the decrease in display quality due to the thickness deviation of the organic light-emitting layer 50.

However, if the second openings OA2 have different widths, the organic light-emitting materials dropped into the second openings OA2 may vary in flow. For example, organic light-emitting material is repulsive to the hydrophobic, second bank 43, so that it may not have a smooth flow but limited flow in the second openings OA2 with a relatively small width. In this case, the flow of organic light-emitting material in the second openings OA with a relatively small width may be limited even if the dummy area DA is added, thereby making it hard to expect the above-stated advantages.

More specifically, the organic light-emitting layer 50 may comprise a first organic light-emitting layer 50-1 that emits a first color, a second organic light-emitting layer 50-2 that emits a second color, and a third organic light-emitting layer 50-3 that emits a third color. Although the drawings illustrate that the first color is blue (B), the second color is green (G), and the third color is red (R), the present invention is not limited to this.

Here, the width of one among a (2-1)th opening OA2-1 where the first organic light-emitting layer 50-1 is formed, a (2-2)th opening OA2-2 where the second organic light-emitting layer 50-2 is formed, and a (2-3)th opening OA2-3 where the first organic light-emitting layer 50-1 is formed may be different from the width of another of them. Here, width refers to distance in the first direction. That is, the widths of the second openings OA2-1, OA2-2, and OA2-3 where the first to third organic light-emitting layers 50-1, 50-2, and 50-3 are formed may be controlled in view of the lifetime and efficiency of selected organic light-emitting material.

For convenience of explanation, a description will be given below with an example in which, in the display area AA, the width W1 of the (2-1)th opening OA2-1 is greater than the width W2 of the (2-2)th opening OA2-2, and the width W2 of the (2-2)th opening OA2-2 is greater than the width W3 of the (2-3)th opening OA2-3.

In a case where the second openings OA2-1, OA2-2, and OA2-3 have different widths W1, W2, and W3 in the display area AA, the organic light-emitting material dropped into the (2-3)th opening OA2-3 with a relatively small width may not spread well as far as the dummy area DA and may have limited flow.

To prevent this, in the fourth exemplary embodiment of the present invention, the second openings OA2-1, OA2-2, and OA2-3 may have different widths W1', W2', and W3' depending on their position in the dummy area DA. For example, in a case where the (2-3)th opening OA2-3 has a small width W3 and the flow of fluid into the dummy area DA is limited, as shown in FIG. 16A, the (2-3)th opening OA2-3 may have a relatively large width W3' in the dummy area DA, as shown in FIG. 16B. In this case, the width W1 of the (2-1)th opening OA2-1 is relatively large, which makes the width W1' of the (2-1)th opening OA2-1 in the dummy area DA shorter to offset the increase in the width of the (2-3)th opening OA2-3. For example, the increase (=W3'-W3) in the width of the (2-3)th opening OA2-3 in the dummy area DA may be substantially equal to the decrease (=W1-W1') in the width of the (2-1)th opening OA2-1. The width W1' of the (2-1)th opening OA2-1 in the dummy area DA may be set within a range in which the flow of fluid is not limited.

While the configuration for controlling the width W1' of the (2-1)th opening OA2-1 and the width W3' of the (2-3)th opening OA2-3 has been illustrated and explained above, the present invention is not limited to this, and if necessary, the width W2' of the (2-2)th opening OA2-2 as well may be adjusted. In this case, the amounts of increase and decrease in the widths of the (2-1)th, (2-2)th, and (2-3)th openings OA2-1, OA2-2, and OA2-3 in the dummy area DA may correspond to each other.

As seen from above, in the fourth exemplary embodiment of the present invention, the organic light-emitting material dropped onto the display area AA may spread well as far as the dummy area DA by controlling the width of the second openings OA2 in the dummy area DA. Accordingly, it is possible to overcome the problem of concentration of solid content of organic light-emitting material at one side in the display area AA, thereby significantly improving the deterioration in display quality due to differences in the thickness of the organic light-emitting layer 50.

It will be apparent that those skilled in the art can make various modifications and changes thereto within the scope without departing from the technical spirit of the present invention through the above descriptions. Therefore, the

What is claimed is:

1. An organic light-emitting display device comprising:
   a substrate comprising a display area including a plurality of sub-pixels arranged along a first direction and a second direction intersecting the first direction and a non-display area surrounding an outer periphery of the display area, the non-display area not overlapping with the sub-pixels, and the non-display area including a dummy area adjacent to the display area along the second direction;
   a thin film transistor in each sub-pixel of the display area, the thin film transistor including a gate electrode, a semiconductor layer, a source electrode, and a drain electrode;
   an overcoat layer on the substrate;
   first electrodes in the sub-pixels of the display area over the overcoat layer;
   a first bank disposed in the display area and the non-display area, the first bank having first openings exposing the first electrodes in the display area;
   a second bank on the first bank in the display area and the non-display area and arranged along the second direction, the second bank having second openings exposing the first openings, the second openings exposing the first bank in at least the display area and the non-display area; and
   organic light-emitting layers within the second openings of the display area and the non-display area, the organic light-emitting layers having concaved surfaces disposed at edges of the non-display area which are in contact with the second bank,
   wherein the first bank is extended to the dummy area,
   wherein the overcoat layer is formed in the display area to cover the gate electrode and the source electrode of the thin film transistor in the display area,
   wherein the second bank is extended to the dummy area, and
   wherein at least one of the second openings is extended to the dummy area to expose the first bank disposed in the dummy area,
   wherein the second bank has a first thickness in an area corresponding to a stepped portion formed on one edge of the overcoat layer and a second thickness in an area corresponding to the display area, and
   wherein the first thickness is greater than the second thickness.

2. The organic light-emitting display device of claim 1, wherein the first electrodes are not disposed in the dummy area so that an image is not displayed in the dummy area.

3. The organic light-emitting display device of claim 1, wherein the second bank has a first width in the first direction in an area corresponding to a stepped portion formed on one edge of the overcoat layer and a second width in the first direction in an area corresponding to the display area,
   wherein the first width is greater than the second width.

4. The organic light-emitting display device of claim 1, wherein at least one of the second openings has a first width in the first direction in the display area and a second width different from the first width in the non-display area.

5. The organic light-emitting display device of claim 1, wherein the first bank is hydrophilic, and the second bank is hydrophobic.

6. The organic light-emitting display device of claim 1, wherein portions of the organic light-emitting layers adjacent to the second bank in the dummy area comprise a mound or a valley.

7. An organic light-emitting display device comprising:
   a substrate comprising a display area including a plurality of sub-pixels arranged along a first direction and a second direction intersecting the first direction and a non-display area surrounding an outer periphery of the display area, the non-display area not overlapping with the sub-pixels, and the non-display area including a dummy area adjacent to the display area along the second direction;
   a thin film transistor in each sub-pixel of the display area, the thin film transistor including a gate electrode, a semiconductor layer, a source electrode, and a drain electrode;
   an overcoat layer on the substrate;
   first electrodes in the sub-pixels of the display area over the overcoat layer;
   a first bank disposed in the display area and the non-display area, the first bank having first openings exposing the first electrodes in the display area;
   a second bank on the first bank in the display area and the non-display area and arranged along the second direction, the second bank having second openings exposing the first openings, the second openings exposing the first bank in at least the display area and the non-display area; and
   organic light-emitting layers within the second openings of the display area and the non-display area, the organic light-emitting layers having concaved surfaces disposed at edges of the non-display area which are in contact with the second bank,
   wherein the first bank is extended to the dummy area,
   wherein the overcoat layer is formed in the display area to cover the gate electrode and the source electrode of the thin film transistor in the display area,
   wherein the second bank is extended to the dummy area,
   wherein at least one of the second openings is extended to the dummy area to expose the first bank disposed in the dummy area, and
   wherein the second openings include:
   (2-1)th openings which have a (1-1)th width in the first direction in the display area; and
   (2-2)th openings which have a (1-2)th width smaller than the (1-1)th width in the first direction in the display area,
   wherein the (2-1)th openings have a (2-1)th width smaller than the (1-1)th width in the first direction in the non-display area, and
   wherein the (2-2)th openings have a (2-2)th width larger than the (1-2)th width in the first direction in the non-display area.

8. The organic light-emitting display device of claim 7, wherein a difference between the (1-1)th width and the (2-1)th width is equal to a difference between the (2-1)th width and the (2-2)th width.

9. The organic light-emitting display device of claim 7, wherein the second openings comprise (2-3)th openings which have a (1-3)th width in the first direction in the display area and the non-display area.

10. The organic light-emitting display device of claim 7, wherein the second openings comprise (2-3)th openings which have a (1-3)th width in the first direction in the display area and a (2-3)th width in the first direction in the non-display area, wherein the (1-3)th width and the (2-3)th width are different.

* * * * *